(12) United States Patent
Kinayman et al.

(10) Patent No.: US 6,201,454 B1
(45) Date of Patent: Mar. 13, 2001

(54) COMPENSATION STRUCTURE FOR A BOND WIRE AT HIGH FREQUENCY OPERATION

(75) Inventors: Noyan Kinayman, Boston, MA (US); Nitin Jain, Karanataka (IN)

(73) Assignee: The Whitaker Corporation, Wilmington, DE (US)

( * ) Notice: Subject to any disclaimer, the term of this patent is extended or adjusted under 35 U.S.C. 154(b) by 0 days.

(21) Appl. No.: 09/280,474

(22) Filed: Mar. 30, 1999

(51) Int. Cl.[7] ....................................................... H03H 7/38
(52) U.S. Cl. .............................. 333/33; 333/247; 257/664
(58) Field of Search ........................ 333/33, 247; 257/664

(56) References Cited

U.S. PATENT DOCUMENTS 4,353,047 * 10/1982 Noguchi et al. ..................... 333/247

6,008,533 * 12/1999 Bruce et al. ......................... 257/691

FOREIGN PATENT DOCUMENTS

0120104 * 4/1987 (JP) ..................................... 333/247

* cited by examiner

Primary Examiner—Justin P. Bettendorf

(57) ABSTRACT

An improved frequency response for a bond wire (1) at high frequency operation is realized by using a matching element (13) including a meander line (9) structure. The frequency response is improved at an operating frequency by design. The matching element (13) compensates the bond wire (1) by tuning it as a length of high impedance transmission line and then completing the combined length of the bond wire (1) and matching element (13) to a length of half of a guided wavelength at the operating frequency

18 Claims, 8 Drawing Sheets

COMPENSATION STRUCTURE FOR A BOND WIRE AT HIGH FREQUENCY OPERATION

FIELD OF THE INVENTION

Embodiments of the present invention relate to impedance compensation structures, and more particularly to a compensated interconnection structure between a semiconductor die or a Monolithic Microwave Integrated Circuit ("MMIC") chip, and a substrate that improves the insertion loss of the interconnection structure at millimeter wave frequencies.

BACKGROUND

Semiconductors for wireless communication applications operate at radio frequencies ("RF") and above. As the applications for wireless communication increase, so does the desirability of making use of many frequency bands in the available spectrum. The millimeter wave spectrum is available and desirable for wireless communication purposes. The millimeter spectrum, however, presents certain engineering challenges due to the increased distortion and loss at millimeter wave frequencies. There is also a greater sensitivity to device parasitics at higher frequencies than radio frequencies ("RF") which are commonly used in wireless communications. Accordingly, the typical parasitics that are tolerated at lower frequencies cannot be ignored at millimeter wave frequencies and still achieve adequate performance for the applications in which they occur.

One of the typical parasitics of all wireless communication systems that include high frequency semiconductors is the complex impedance, primarily inductance, of the bond wire. The bond wire is typically a length of gold wire or ribbon that is connected using ultrasonic energy to a semiconductor device or a MMIC chip contact on one end and an interconnecting contact on an opposite end. The interconnecting contact is typically a conductive pad on a substrate such as a chip on board printed circuit substrate onto which the semiconductor die or MMIC chip is directly attached. With this connection style, there is conventionally a length of wire that has a significant inductive component at millimeter wave frequencies. Conventionally, serial discrete capacitors are used to tune the inductance of the bond wire to a resonant condition. Discrete capacitors, however, are large and take up too much substrate, which is in contravention of the interest in miniaturization. In addition, the normal discrete capacitor tolerances and inherent parasitics render accurate tuning at millimeter wave frequencies impractical from a manufacturing view point. Production errors in certain types of appropriate capacitors can also reduce the total yield of the circuit making the manufacturing process costly. There remains a need, therefore, for a manufacturable and small apparatus for compensating typical bond wire parasitics at millimeter wave frequencies.

SUMMARY

It is an object of an embodiment according to the teachings of the present invention to improve the frequency performance of bond wire interconnects at millimeter wave frequencies.

It is a further object of an embodiment according to the teachings of the present invention to provide a compensation device that is small and simple.

It is a further object of an embodiment according to the teachings of the present invention to provide a compensation device that is reliably manufacturable, repeatable, and low cost.

A semiconductor die or a MMIC chip for attachment to a substrate has a die contact for electrical connection thereto, and an interconnection tuned for operation at an operating frequency. The interconnection is a bond wire connected to the die contact and extends to a substrate contact. The bond wire has a wire length and an associated impedance value. The interconnection further includes a matching element connected to the substrate contact opposite the bond wire. The matching element has a first connecting element, a meander line, and a second connecting element. The matching element is tuned to combine with the bond wire to create a high impedance transmission line which length is substantially equal to half of a guided wavelength of the operating frequency.

A method for making a compensated bond wire comprises the steps of identifying the bond wire to be compensated, and obtaining a predictive model for it. The method further comprises identifying an operating frequency, and calculating an electrical length of a guided half wavelength at the operating frequency. A length of the bond wire is identified, and is subtracted from the length of the guided half wavelength to arrive at the electrical length of a matching element. The method fits a model of the matching element comprising first and second connecting elements and a meander line to the calculated electrical length of the matching element. The method then calls for simulating the electrical behavior of the fitted matching element, and then optimizing a frequency response of the matching element by varying a length of the meander line to combine with the bond wire to achieve an electrical length substantially equal to the guided half wavelength of the operating frequency.

It is a feature of an embodiment according to the teachings of the present invention that a meander line is used for compensating the bond wire impedance to achieve a total electrical length, when combined with the bond wire and the connection elements, equal to a guided half wavelength of the operating frequency.

It is a feature of an embodiment according to the teachings of the present invention that the tuning element is easily and repeatably fabricated with conventional printed transmission line technology.

It is an advantage of an embodiment according to the teachings of the present invention that a wire bond can be used for interconnection at millimeter wave frequencies.

It is an advantage of an embodiment according to the teachings of the present invention that a tuned bond wire is reliably manufacturable.

It is an advantage of an embodiment according to the teachings of the present invention that a tuned bond wire is small and performs according to predictive modeling.

It is a further advantage of an embodiment according to the teachings of the present invention that a compensated bond wire can be manufactured at a low cost.

DETAILED DESCRIPTION OF THE PREFERRED EMBODIMENTS

Figure 1:
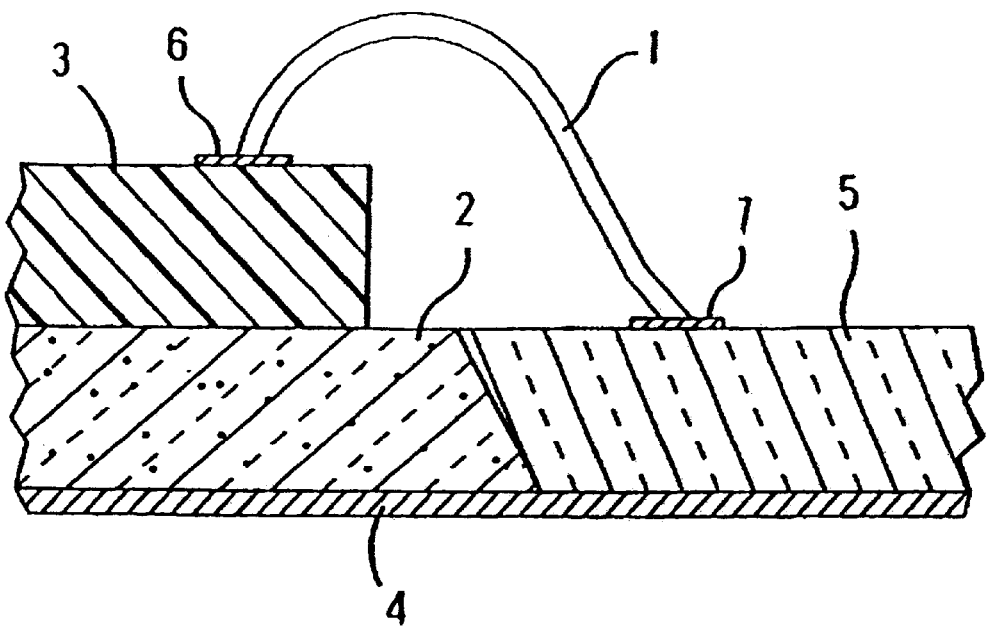
FIG. 1 is an illustrative simplified side view of a bond wire making an electrical interconnection between a semiconductor die or a MMIC chip contact pad, and a substrate contact pad.
Figure 2:
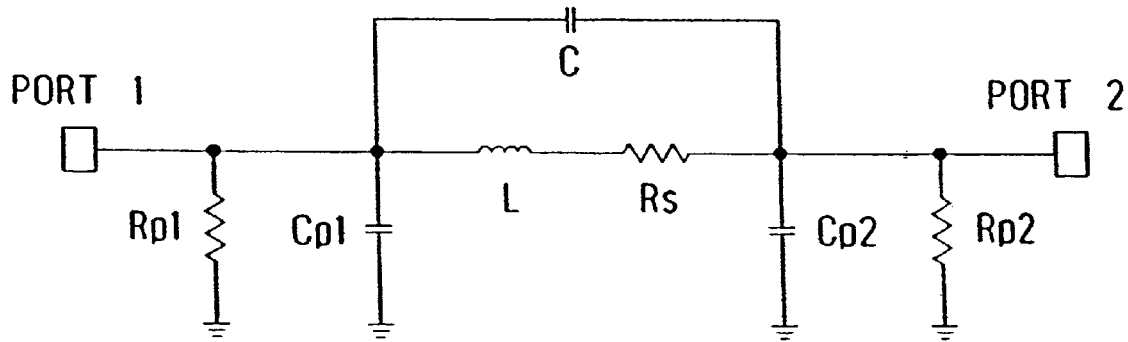
FIG. 2 is a circuit diagram showing a lumped element equivalent of a bond wire and associated parasitics.

With specific reference to FIG. 1 of the drawings, there is shown a side view of a typical bond wire or bond ribbon 1 as it is attached between a die 3 and a substrate 5. For purposes of the present disclosure, the term "bond wire" is used to refer to any uncompensated interconnection between two electrical points. Ends of the bond wires 1 are typically attached to a die or MMIC contact 6 and a substrate contact 7 respectively using conventional bond wire attachment technology. Design of a compensation structure for the bond wire 1 begins by establishing a lumped element equivalent model of the bond wire. This establishment can occur in many ways including using a model already established or using a software program such as ANSOFT's "Maxwell" software program based upon the materials and geometry of the bond wire of interest. FIG. 2 of the drawings shows a lumped element equivalent model of the bond wire at high frequencies in which the bond wire is modeled as an inductor (L) in series with a resistor ($R_S$). Other typical parasitics included in the model are two parallel resistor-capacitor circuits ($R_{p1}$&$C_{p1}$, $R_{p2}$&$C_{p2}$) between each end of the bond wire and reference potential. As an example, a typical wire bond length is approximately 470 microns. For the example bond wire and with reference to FIG. 2 of the drawings, lumped element values with f as the operating frequency are:

| | |
|---|---|
| L | 0.24 nH |
| $R_s$ | 0.04 $\sqrt{f}$ Ω |
| C | approx. 0 |
| $C_{p1}$ | 15 fF |
| $C_{p2}$ | 13 fF |
| $R_{p1}$ | 86 kΩ |
| $R_{p2}$ | 65 KΩ |

Figure 3A:
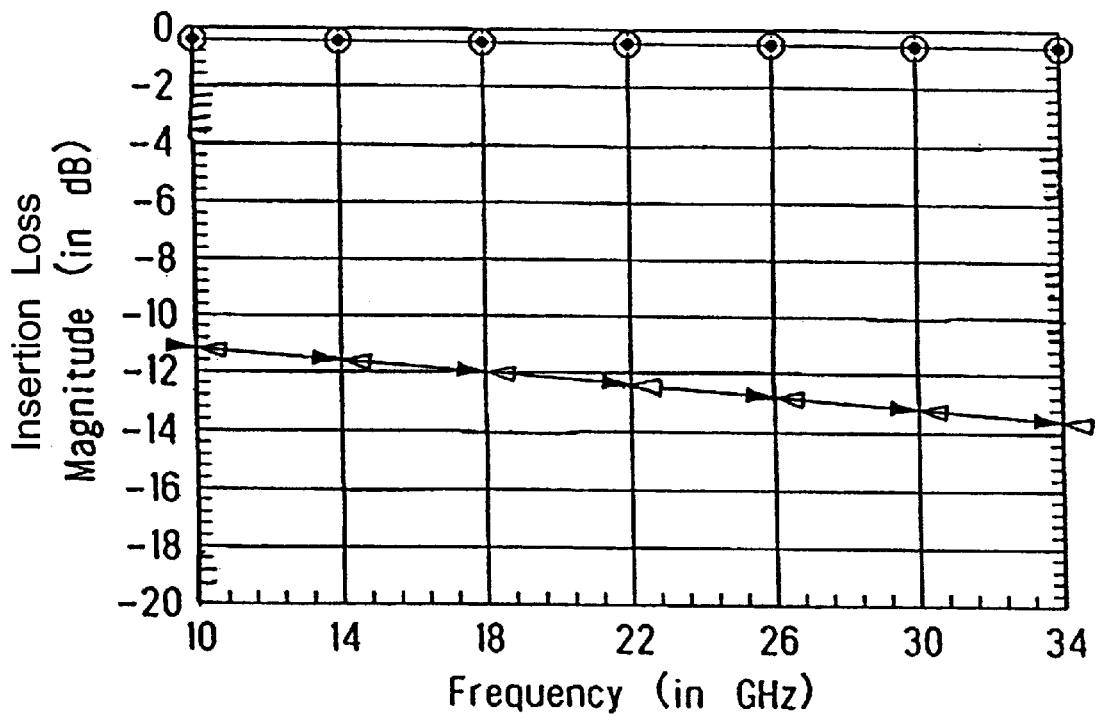
FIGS. 3A and 3B are graphs respectively depicting insertion loss ($S_{12}$) and reflection coefficient ($S_{11}$) for a full wave simulation of a bond wire as compared to the lumped element equivalent of the same bond wire.
Figure 3B:
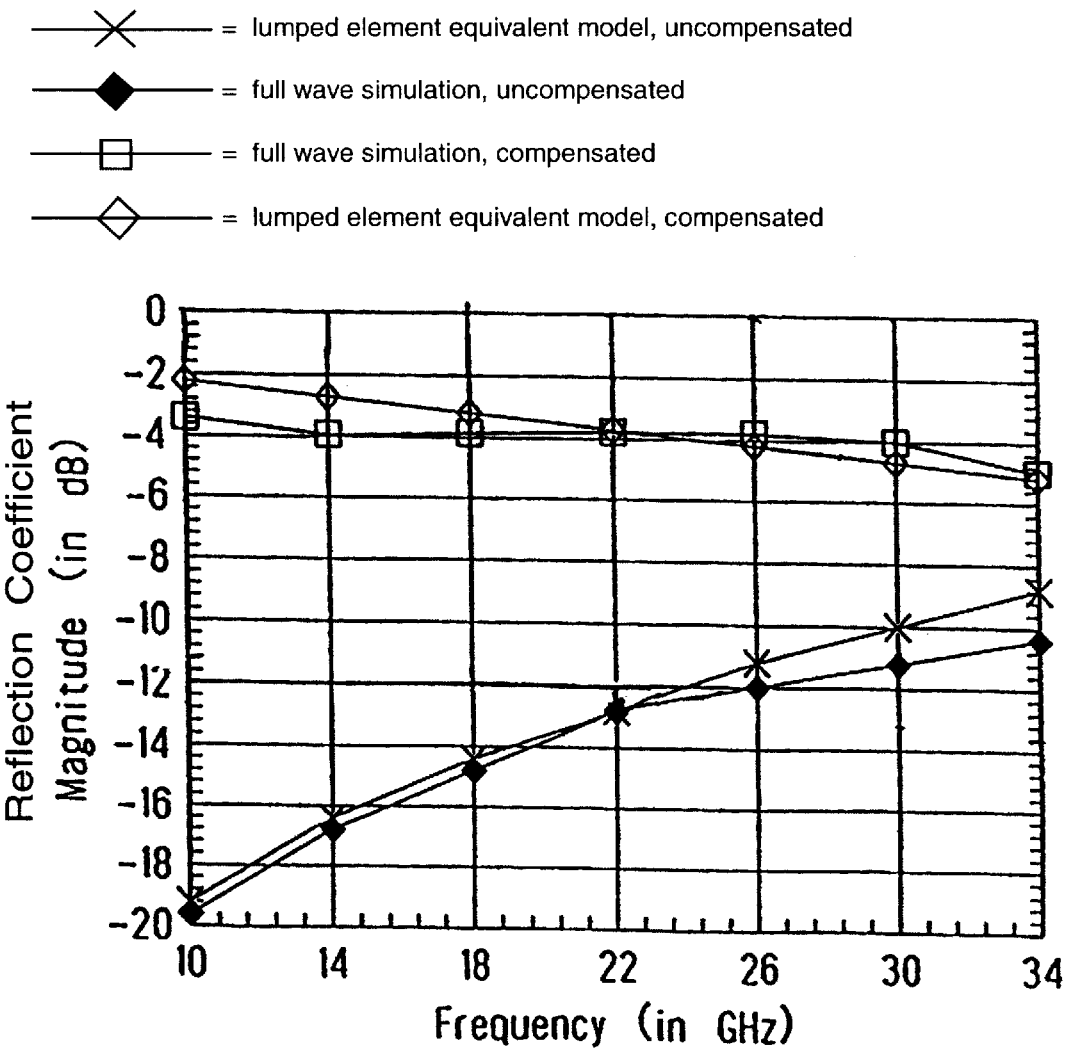

Note that while the value of the capacitor, C, in parallel with the inductive, L, impedance of the bond wire was determined to be zero, it is included in the initial model for completeness. FIGS. 3A and 3B are graph respectively showing the verification of the lumped element equivalent circuit model results as compared to the full wave simulation results as a function of frequency showing that the lumped element equivalent model provides a good indication of bond wire behavior at the frequencies of interest. In the figure captions, M and S stand for the extracted lumped model response and the full-wave simulation results, respectively. It should be noted that it is unimportant to the teachings of the present invention that a particular kind of interconnect or bond wire is used. It is only important that a reliable and accurate lumped element equivalent circuit is known for the bond wire, bond ribbon, or other similar structure. An operating frequency is identified which is based upon the frequency or frequency range of the desired application. The operating frequency is the frequency at which the electrical behavior of the bond wire will be tuned to be most ideal. If a frequency range is of interest, a frequency value that is centered in the range is used as the operating frequency for the remainder of the compensated interconnect design process In order to find the lumped-model component values, the scattering parameters of the bond wire over a broad frequency range that includes the operating frequency are obtained Scattering parameters may be generated using ANSOFT's "Maxwell" computer program and are imported as a data set into a simulation program such as HEWLETT PACKARD Company's "Libra" software. Alternatively, the scattering parameters might also be obtained from the direct measurement of the bond wire itself. After obtaining the scattering parameters, the simple lumped model of the bond wire is drawn in the "Libra" software and the component values are extracted through an optimization algorithm built in "Libra" software by comparing the model response with scattering parameters obtained from bond wire measurement or the "Maxwell" software.

Figure 4:
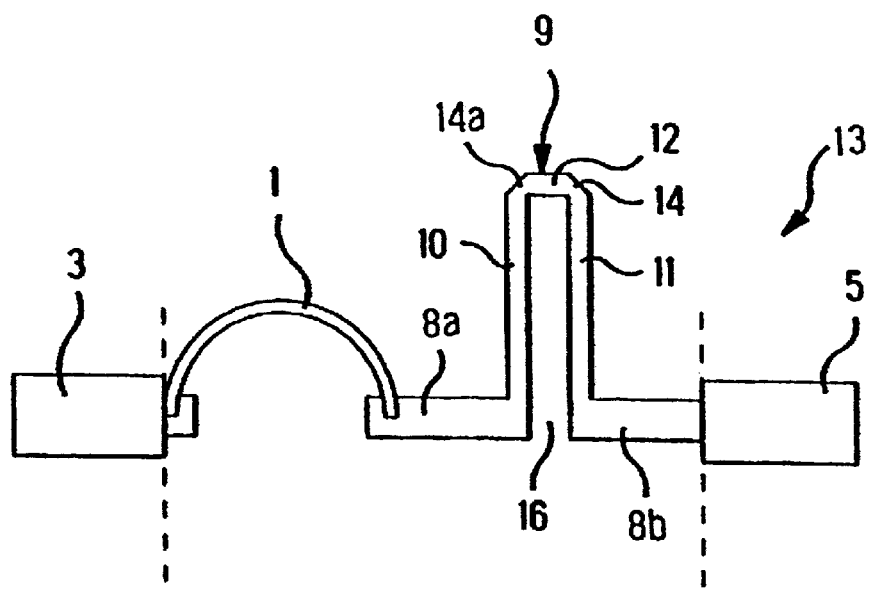
FIG. 4 is a cartoon diagram showing an embodiment according to the teachings of the present invention with a bond wire connected to a matching element, the dotted lines showing the reference planes.

A matching element 13 is chosen to tune the lumped element equivalent circuit of the modeled bond wire at the operating frequency. The design process for the matching element strives to create a structure in such a way that when the total length of the matching element is combined with the length of the bond wire, the overall circuitry exhibits a transmission line response whose length is half of the guided wavelength of the operating frequency. From the classical transmission line theory, it is known that a half wavelength transmission line translates its input impedance to its output (i.e. 50 Ohm.). Accordingly, a distributed equivalent model of the matching circuit is drawn in the "Libra" software as being placed in series with the bond wire lumped element equivalent model. The matching element 13 according to the teachings of the present invention comprises a first connecting element 8a comprising a length of transmission line connected at a right angle to a meander line 9 at an open end 16 of the meander line 9. The meander line 9 comprises a first parallel length 10 of transmission line connected to a spacing element 12 by a first right triangle element 14a. The first parallel length 10 is contiguous with the first right triangle element 14a, which is contiguous with the spacing element 12. A second parallel length 11 of transmission line is connected to an opposite end of the spacing element 12 by a second right triangle element 14. As FIGS. 4 and 6 of the drawings show, the spacing element 12 is contiguous with the second right triangle element 14 which is contiguous with the second parallel length 11. A second connecting element 8b is connected to the second parallel length 11 at an open end 16 of the meander line 9 to complete the matching element 13. The "Libra" model for the matching element 13 as described comprises a series circuit of a transmission line modeling the first connecting element 8a, a transmission T connection modeling a right angle interconnect, a transmission line modeling the first parallel length 10, a right bend modeling the first right triangle element 14a, a transmission line modeling the spacing element 12, a left bend modeling the second right triangle element 14, a transmission line modeling the second parallel length 11, a transmission T modeling a right angle interconnect, and a transmission line modeling the second connecting element 8b. The length and width of the transmission lines that make up the constituent parts of the matching element 6 are variable in order to optimize the tuning of the matching element 13. For completeness, the first and second parallel lengths 10, 11 of the meander line 9 are modeled as coupled transmission lines and a gap is modeled at the open end 16 of the meander line 9. Relative constraints of the variable lengths include the assumptions that the first and second parallel lengths 10, 11 are equal in length and the first and second connecting elements 8a, 8b are equal in length For purposes of the design of the meander line, the first and second parallel lengths should be spaced a distance greater or equal than one substrate height from each other so as to prevent coupling between the elements that may deteriorate the response. However, the best way of verifying this is to use a circuit simulator because the coupling depends on the electrical width of the lines as well as the spacing. In the case presented here, the parallel sections of the meander line are separated by 100 microns, and for the sake of completeness, the meander line is simulated by using coupled lines in the circuit simulator. Note that a meander line is used instead of a straight line to reduce the area required by the matching circuit.

Figure 5:
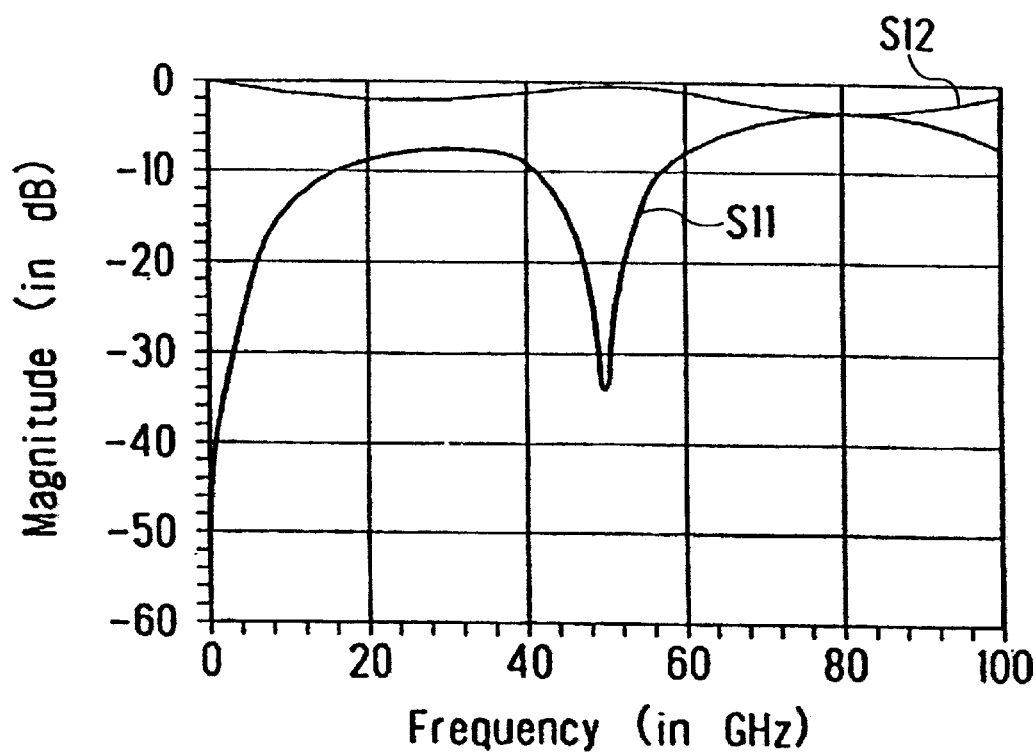
FIG. 5 is a graph showing the insertion loss and reflection coefficient of an embodiment of a matching element according to the teachings of the present invention as a function of operating frequency.

The length of the bond wire is then subtracted from the guided half wavelength of the operating frequency in order to establish an approximate length for the matching element 13. The bond wire 1 acts as a high 25 impedance transmission line because its structure is narrow and suspended in air. Accordingly, the meander line 9 is formed out of a high impedance transmission line whose characteristic impedance is selected near to 100 Ohms at the operating frequency. In this way the meander line is a natural continuation, from a transmission line point of view, of the wire bond. From another point of view, the bond wire with the parameters L, $R_S$, $C_{p1}$, $C_{p2}$, $R_{p1}$, and $R_{p2}$ (See FIGS. 2 and 6 of the drawings) is treated as a small high-impedance transmission line segment. The parameters of the matching element 13 are adjusted so that the total length of the bond wire and matching element 13 is substantially half of the guided wavelength at the operating frequency. Therefore, the overall compensated bond wire system acts as a half-wavelength impedance transformer. Intuitively, it can be said that the principle of operation is to shift the resonance point as seen in FIG. 5 of the drawings, to the operating frequency by adjusting certain parameters of the matching element 13. Accordingly, the matching element 13 has the following variable parameters: length of the first and second connecting elements 8a, 8b, width of the first and second connecting elements 8a, 8b, length of the first and second parallel lengths 10,11 of the meander line 9, width of the first and second parallel lengths 10,11 of the meander line, and length of the spacing element 12. Using the relative constraints as well as the constraint that the total length of the matching element 13 plus the bond wire equals the guided half wavelength of the operating frequency, the individual parameters are varied to arrive at an impedance value, which is primarily capacitive, that compensates for the primarily inductive impedance of the bond wire as predicted by the bond wire model. The parameters are varied by using an optimization algorithm or by hand at the operating frequency until the insertion loss is minimized at the operating frequency. Since there are relatively few variable parameters, one of ordinary skill in the art can find the solution by tuning the elements manually in a circuit simulator. Strictly speaking, there can be more than one set of possible parameters.

Figure 6:
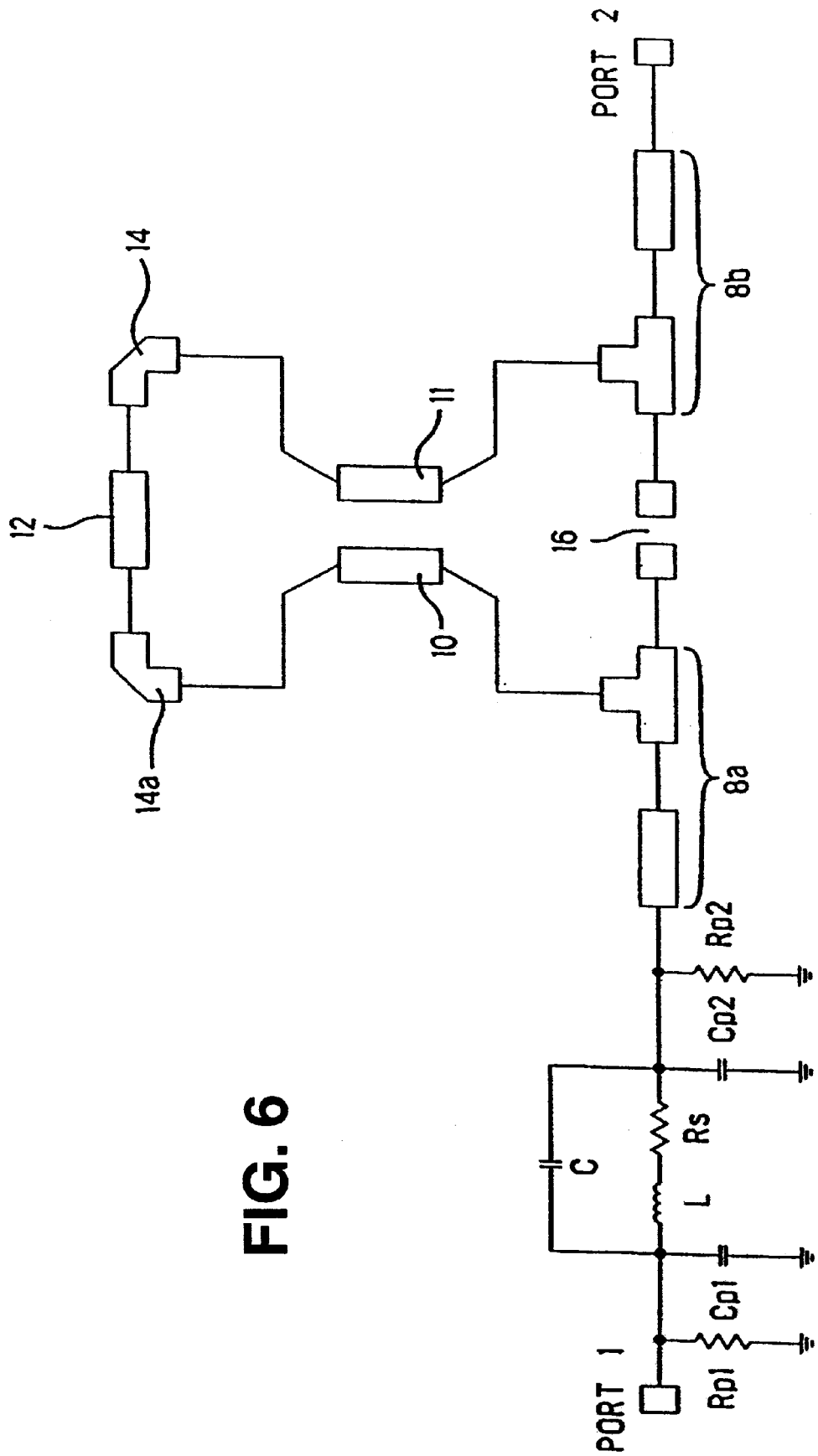
FIG. 6 is a schematic representation of a lumped element equivalent of the bond wire and matching element used in a simulator model.
Figure 7:
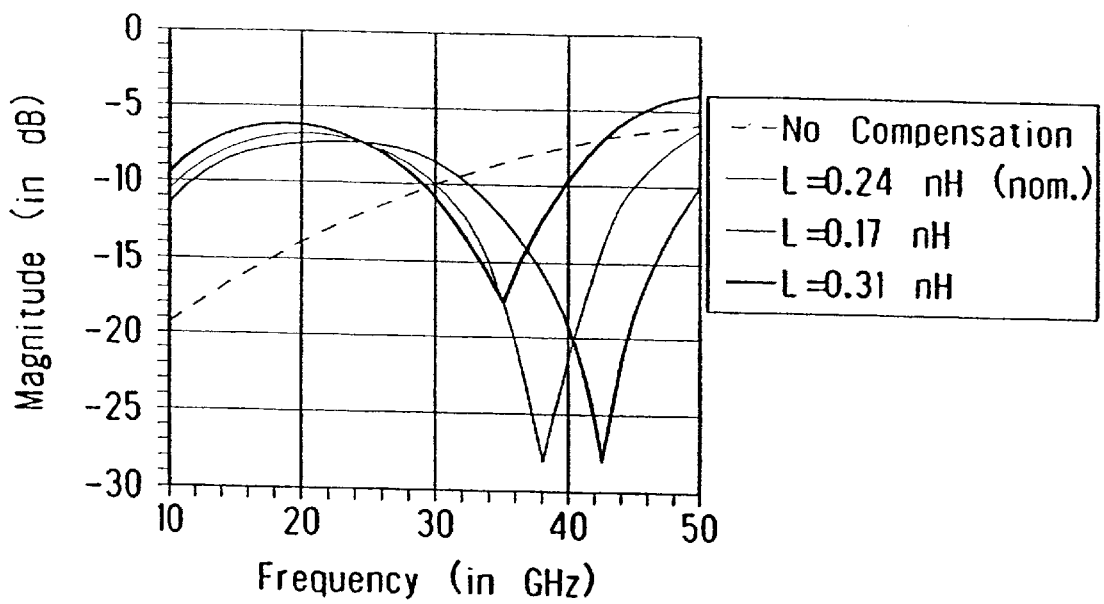
FIG. 7 is a graph showing, by results obtained using a simulation program the reflection coefficient of the uncompensated bond wire as compared to three different compensated bond wires as a function of frequency.
Figure 8:
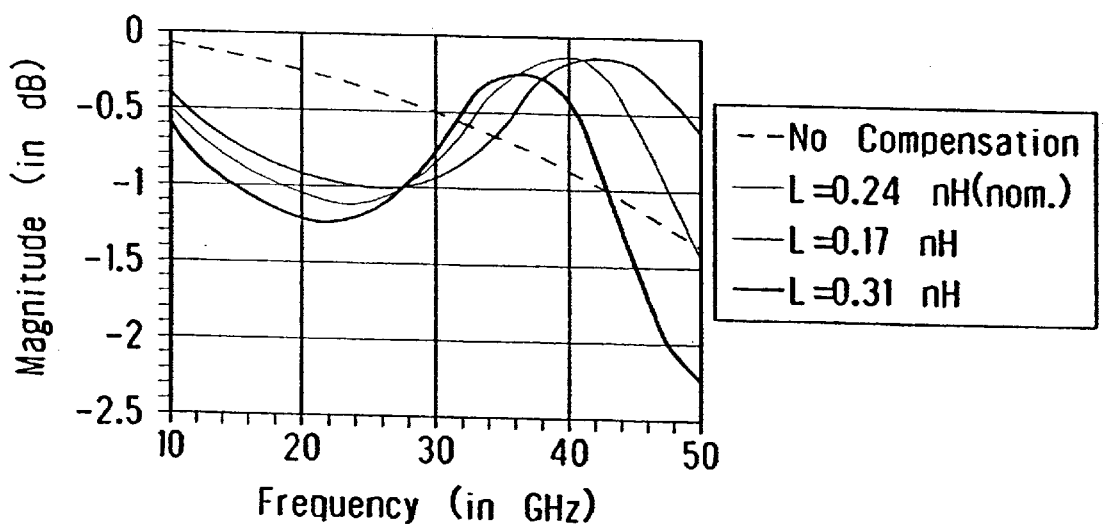
FIG. 8 is a graph showing, by results obtained using a simulation program the insertion loss of the uncompensated bond wire as compared to three different compensated bond wires as a function of frequency.
Figure 9:
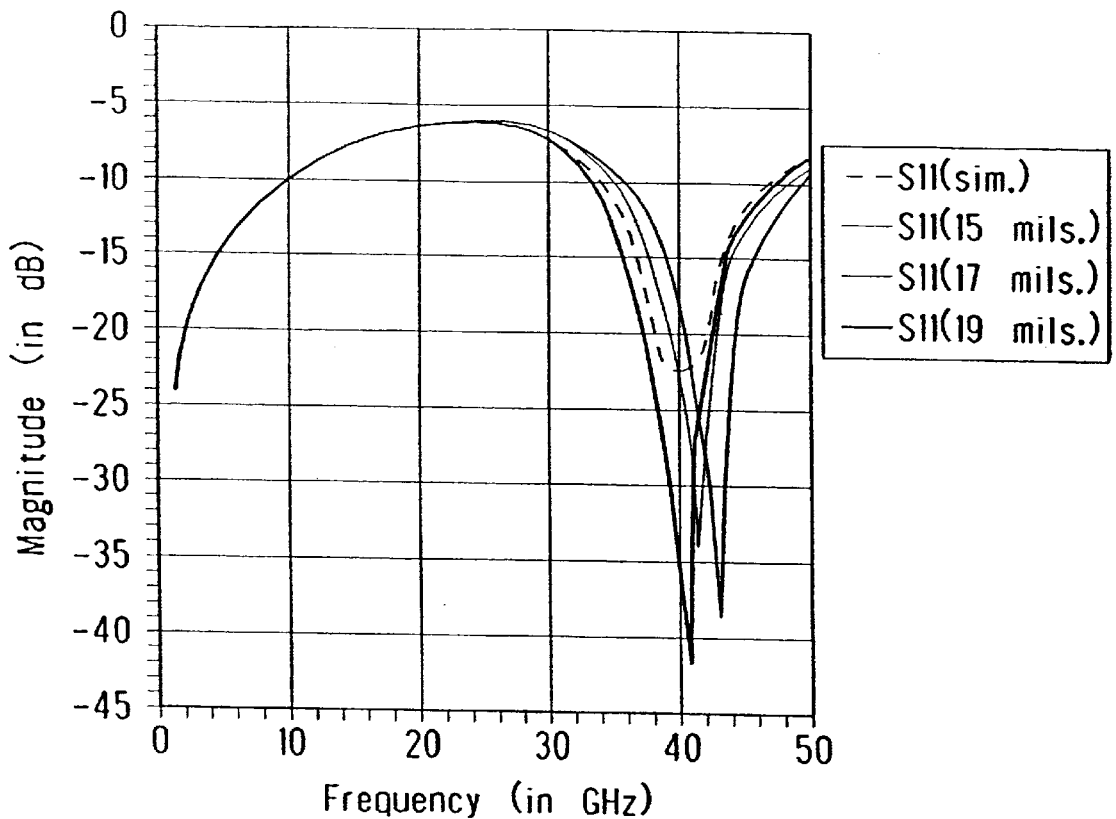
FIG. 9 is a graph showing the measured reflection coefficient of three compensated bond wires with different lengths according to the teachings of the present invention as compared to simulated results.
Figure 10:
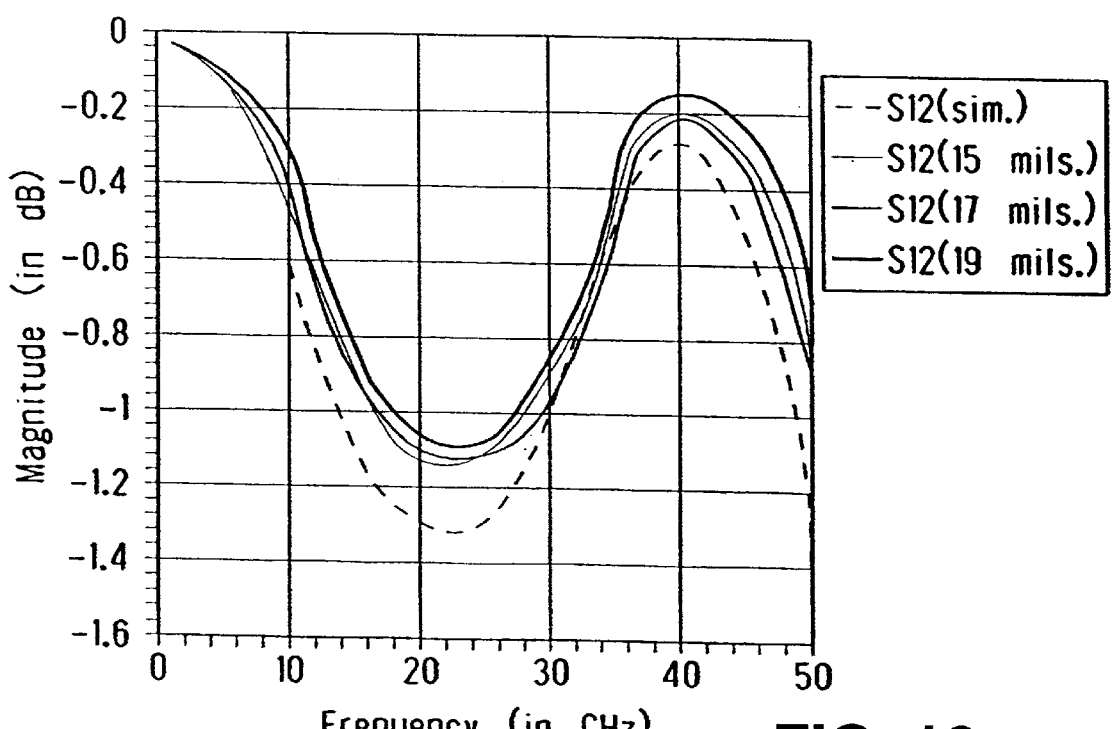
FIG. 10 is a graph showing the measured insertion loss of three compensated bond wires with different lengths according to the teachings of the present invention as compared to the simulated results.

With specific reference to FIG. 6 of the drawings, there is shown a model of a compensated bond wire according to the teachings of the present invention. FIGS. 7 and 8 show the comparison of the reflection coefficient and insertion loss, respectively, of the uncompensated bond wire as compared to the compensated bond wire as a function of frequency. The simulated data show that at the operating frequency, there is a significantly improved impedance match in the compensated bond wire according to the teachings of the present invention For purposes of completeness, FIGS. 9 and 10 of the drawings show the comparison of the reflection coefficient and insertion loss as measured for three different bond wires showing the strong correlation to the simulated data and the strong repeatability of the design approach. Note that the 0.24 nH inductance corresponds to approximately 18.5 mil bond wire length for the configuration previously discussed. The slight mismatch between the measured and the simulated data could be due to over or under estimated bond wire lengths, and imperfect positioning of the bond wire connection point on the matching element side.

Figure 11:
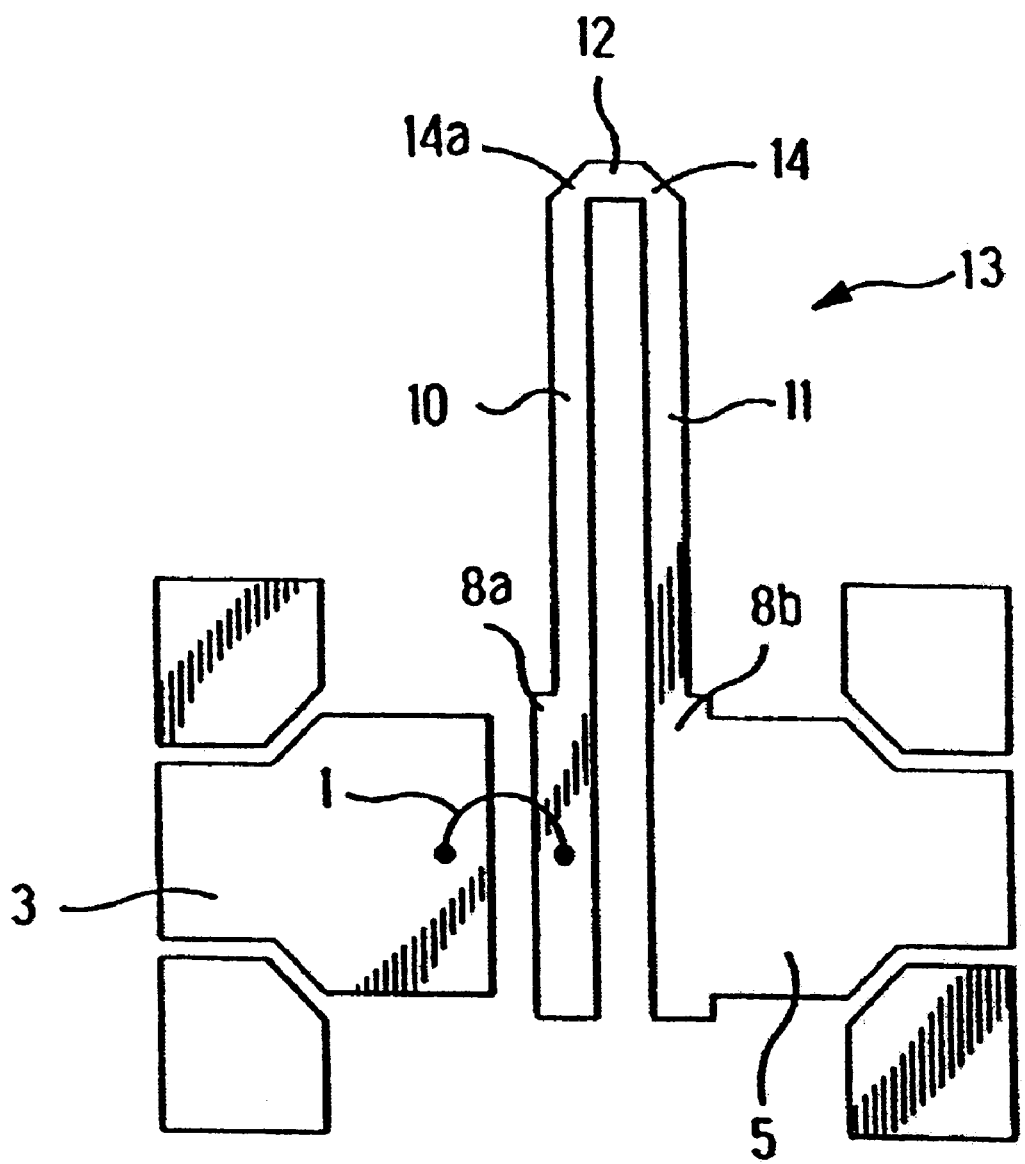
FIG. 11 is a picture showing a manufactured compensated bond wire structure.

FIG. 11 of the drawings shows a measured bond wire and compensation circuit Note that the bond wire shown in the picture is a bond wire from one pad on a microstrip circuit to another pad on the same plane. As stated previously, the method is applicable to any kind of bond wire as far as the lumped model is available or found.

What is claimed is:

1. An interconnection for a semiconductor die or a MMIC chip disposed on a substrate, the die or chip having a die contact for electrical connection thereto, the interconnection tuned for operation at an operating frequency, the operating frequency having a half of a guided wavelength and comprising:

a bond wire connected to the die contact and extending to a substrate contact, the bond wire having a wire length and an associated impedance value, and a matching element connected to the substrate contact opposite the bond wire, the matching element comprising a high impedance transmission line in which the total electrical length of the matching element plus the bond wire is substantially equal to the half of the guided wavelength at the operating frequency.

2. An interconnection for a semiconductor die or a MMIC chip disposed on a substrate as recited in claim 1 wherein said matching element further comprises a first connecting element, a meander line, and a second connecting element, the matching element tuned to combine with the bond wire creating said high impedance transmission line.

3. An interconnection for a semiconductor die or a MMIC chip disposed on a substrate as recited in claim 2, wherein said meander line comprises a first parallel length of transmission line interconnected to the first connecting element, a second parallel length of transmission line parallel to said first parallel length, and a spacing element connected at a right angle to the first and second parallel lengths of transmission line.

4. An interconnection for a semiconductor die or a MMIC chip disposed on a substrate as recited in claim 3 wherein said spacing element comprises a length of transmission line having first and second right triangle elements at each end for interconnection to each one of said first and said second parallel lengths of transmission line.

5. An interconnection for a semiconductor die or a MMIC chip disposed on a substrate as recited in claim 4 wherein a width of the spacing element is substantially equal to a width of the first and second parallel transmission lines.

6. An interconnection for a semiconductor die or a MMIC chip disposed on a substrate as recited in claim 2 wherein there are at least two meander lines connected in series.

7. A method for making a compensated bond wire comprising the steps of:
    identifying the bond wire to be compensated,
    obtaining a predictive model for said bond wire,
    identifying an operating frequency,
    calculating an electrical length of a guided half wavelength at the operating frequency,
    identifying a length of the bond wire,
    subtracting the length of the bond wire from the guided half wavelength to arrive at the electrical length of a matching element,
    establishing a distributed circuit model of the matching element comprising first and second connecting elements and a meander line according to the electrical length of the matching element,
    simulating the electrical behavior of the established matching element,
    optimizing a frequency response of the matching element by varying a length of the matching element to combine with the bond wire to achieve a transmission line response whose electrical length is substantially equal to the guided half wavelength at the operating frequency.

8. A method as recited in claim 7 and further comprising the step of optimizing a frequency response of the matching element by varying a width of the meander line to match a characteristic impedance of the matching element to a characteristic impedance of the bond wire.

9. A method as recited in claim 7 wherein said meander line comprises first and second parallel lengths electrically connected together by a spacing element.

10. A method as recited in claim 9, said matching element further comprising first and second connecting elements on each side of said meander line.

11. A method as recited in claim 10, wherein said first and second connecting elements are substantially equivalent in length.

12. A method as recited in claim 9, wherein said first and second parallel lengths are substantially equivalent in length.

13. A semiconductor structure comprising one of a semiconductor die and a MMIC chip disposed on a substrate, the one of a semiconductor die and MMIC chip having a die contact (6) for electrical connection to the substrate, CHARACTERIZED BY
    an interconnection structure between the die contact and the substrate, the interconnection structure being tuned for operation at an operating frequency having a half of a guided wavelength, wherein the interconnection structure includes
    a bond wire connected to the die contact and extending to a substrate contact, the bond wire having a wire length and an associated impedance value, and
    a matching element connected to the substrate contact opposite the bond wire, the matching element comprising a high impedance transmission line in which the total electrical length of the matching element plus the bond wire is substantially equal to half of the guided wavelength at the operating frequency.

14. The structure as recited in claim 13, FURTHER CHARACTERIZED IN THAT the matching element comprises a first connecting element, a meander line, and a second connecting element, and in that the matching element is tuned to combine with the bond wire creating said high impedance transmission line.

15. The structure as recited in claim 14, FURTHER CHARACTERIZED IN THAT the meander line comprises a first parallel length of transmission line interconnected to the first connecting element, a second parallel length of transmission line parallel to said first parallel length, and a spacing element connected at a right angle to the first and second parallel lengths of transmission line.

16. The structure as recited in claim 15, FURTHER CHARACTERIZED IN THAT the spacing element comprises a length of transmission line having first and second right triangle elements at each end for interconnection to each one of said first and said second parallel lengths of transmission line.

17. The structure as recited in claim 16, FURTHER CHARACTERIZED IN THAT a width of the spacing element is substantially equal to a width of the first and second parallel transmission lines.

18. The structure as recited in claim 14, FURTHER CHARACTERIZED IN THAT there are at least two meander lines connected in series.

* * * * *